United States Patent
Choi et al.

(10) Patent No.: US 6,583,577 B1
(45) Date of Patent: Jun. 24, 2003

(54) ELECTRO-LUMINESCENT DISPLAY AND DRIVING METHOD THEREOF

(75) Inventors: Woong-Sik Choi, AnSan-shi (KR); Sung-Joon Bae, SungNam-shi (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/640,692

(22) Filed: Aug. 18, 2000

(30) Foreign Application Priority Data

Sep. 21, 1999 (KR) ............................................. 99-40743

(51) Int. Cl.[7] ................................................. G09G 3/10
(52) U.S. Cl. ........................ 315/169.3; 345/76; 345/77
(58) Field of Search ........................... 315/169.3, 169.1; 345/76, 77, 92; 257/59, 72; 313/500, 505, 506

(56) References Cited

U.S. PATENT DOCUMENTS

| | | | |
|---|---|---|---|
| 4,042,854 A | * 8/1977 | Luo et al. ..................... | 313/505 |
| 5,384,517 A | 1/1995 | Uno .......................... | 315/169.3 |
| 5,670,792 A | * 9/1997 | Utsugi et al. .................. | 257/59 |
| 5,688,551 A | * 11/1997 | Littman et al. ................ | 427/64 |
| 5,897,328 A | * 4/1999 | Yamauchi et al. . | 148/DIG. 150 |
| 5,903,246 A | * 5/1999 | Dingwall ..................... | 345/46 |
| 6,057,647 A | * 5/2000 | Kurosawa et al. ....... | 315/169.3 |

* cited by examiner

Primary Examiner—Don Wong
Assistant Examiner—Ephrem Alemu
(74) Attorney, Agent, or Firm—McKenna Long & Aldridge LLP

(57) ABSTRACT

An electro-luminescent (EL) display includes a gate line, first to third data lines defining first to third pixel regions, respectively, the first to third data lines crossing with the gate line, first to third power supply lines passing through the first to third pixel regions, switching devices connected electrically to the gate line and the data lines, the switching devices formed in the respective pixel regions, driving devices in the respective pixel regions wherein each gate and source of the driving devices are connected to each electrode of the switching devices and the power supply lines, respectively, first to third EL diodes connected to drains of the driving devices, the first to third EL diodes corresponding to the first to third pixel regions, respectively, and first to third power source supply terminals connected to the first to third power supply lines, respectively. Accordingly, the R, G, and B pixels may be independently driven without a complicatedly-designed data driving circuit, thereby simplifying the data driving circuit as well as reducing the product cost.

9 Claims, 4 Drawing Sheets

ELECTRO-LUMINESCENT DISPLAY AND DRIVING METHOD THEREOF

CROSS REFERENCES TO RELATED APPLICATIONS

This application claims priority from Korean Patent Application No. P1999-40743 filed on Sep. 21, 1999, the entirety of which is hereby incorporated by reference for all purposes as if fully set forth therein.

BACKGROUND OF THE INVENTION

1. Field of Invention

The present invention relates to an electro-luminescent display and a driving method thereof, more particularly, to an active type matrix electro-luminescent display and a driving method thereof.

2. Discussion of Related Art

An electro-luminescent display (hereinafter abbreviated ELD) is a display device which uses electro-luminescence of excited molecules generated from recombined electrons and holes which are injected outside the ELD. The thickness of an ELD is greatly reduced compared to other displays because it does not require a back light. It also can decrease power consumption compared to other displays. Therefore, the ELD has been focused upon as a next generation display.

FIG. 1 shows a general schematic equivalent circuit of a unit cell in ELD. Referring to FIG. 1, a pixel region is defined by a gate line G and a data line D crossing each other. And a power supply line L is arranged in parallel with the data line D. Alternatively, the power supply line L may be arranged to be parallel with the gate line G. The pixel region includes a switching device T1, a driving device T2, a storage capacitor C, and an electro-luminescent (EL) diode EL.

A gate, a source, and a drain of the switching device T1 are connected to the gate line G, the data line D, and another gate of the driving device T2, respectively. And a drain and a source of the driving device T2 are connected to an anode + of the EL diode EL and the power supply line L, respectively.

The storage capacitor C is connected between the gate of the driving device T2 and the power supply line L. And, a cathode − of the EL diode EL is connected to a terminal 10 of a common electrode.

The operation of the above-mentioned ELD is explained in the following description.

If the gate line G connected to the switching device T1 is selected to be turned on by a gate driver (not shown in the drawing), a data signal from the data line D connected to the switching device T1 is stored in the storage capacitor. On the other hand, if the switching device T1 is turned off, a voltage of the storage capacitor is maintained as it is until the gate line G is selected again.

In this case, the storage capacitor C keeps the voltage applied between the gate and source of the driving device T2. Thus, a source current depending on the gate voltage of the driving device T2 is transferred to the common electrode 10 through the driving device T2 and the EL diode EL from the power supply line L, thereby resulting in the luminescence of the EL diode. Thus, the driving device T2, which reacts on a selection signal applied selectively to the gate line G and the data line D, controls the current flowing from the power supply line L through the driving device T2.

The current of the EL diode EL is controlled by the driving device T2, and the EL diode EL emits light with a brightness corresponding to the current flowing through it. For instance, if a predetermined gate voltage is applied to the gate of the driving device T2, the level of the current flowing through the driving device T2 is determined and the other current flowing through the EL diode EL is fixed in accordance with the current of the driving device T2.

FIG. 2 shows a circuit of an ELD according to a related art, wherein pixels emitting red, green, and blue light R, G, and B, respectively are arranged on a substrate.

The basic structures of the respective pixels are the same as those explained in FIG. 1. Thus, the description of the same parts will be skipped in the following description.

Referring to FIG. 2, a plurality of pixel regions are defined by a plurality of gate lines G1, G2, . . . , and data lines D1, D2, . . . crossing one another. And, a plurality of power supply lines L1, L2, L3, . . . are arranged in parallel with the data lines D1, D2, D3, . . . Alternatively, the power supply lines may be arranged in parallel with the gate lines.

A plurality of the power supply lines L1, L2, L3, . . . formed in the respective pixel regions are connected to a single wire 20 in common, thereby receiving commonly a voltage from an extra power source voltage terminal 21.

Each of the pixel regions is equipped with a switching device T1, a driving device T2, a storage capacitor C, and an EL diode EL. A reference numeral 22 designates a common electrode terminal connecting the respective EL diodes EL in common.

Each of the pixels may be defined by "R", "G", and "B" pixels emitting red, green, and blue light, respectively according to the luminescent colors emitted by the respective EL substances constructing each EL diode EL. The R, G, and B pixels are arranged as a unit.

The unit constructed with the R, G, and B pixels determine a certain color to be displayed by the combination of the three colors. The display is designed to produce colors, and the selection of a white color depends on various environmental conditions. Producing the white color from combination of the basic colors of R, G, and B (hereinafter abbreviated 'white balance') depends on the chromaticity and the brightness of the basic colors.

However, the respective EL diodes of the R, G, and B pixels, as shown in FIG. 3, exhibit a variety of brightness characteristics, depending upon the current.

Namely, when the same current flows through the respective pixels, the EL diodes R-EL, G-EL, and B-EL of the R, G, and B pixels produce different brightness levels.

Moreover, the respective brightness of the red, blue, and green lights required for the white balance of the ELD are different from one another due to the different EL substances constructing the EL diode.

Therefore, the ELD according to the related art is unable to produce colors properly, provided that the same driving waveform is applied to the respective pixels.

Namely, when the same data driving waveform is applied to the R, G, and B pixels, as is the case with a liquid crystal display using color filters, it is impossible to meet the brightness required for the respective pixels due to the different brightness of the respective EL substances constructing the EL diode according to the respective currents.

Therefore, the related art requires a driver which drives the R, G, and B pixels independently, thereby making the design of a data driving circuit of the ELD complicated, and increasing the product cost thereof.

SUMMARY OF THE INVENTION

Accordingly, the present invention is directed to an electro-luminescent display and a driving method thereof that substantially obviate one or more of the problems due to limitations and disadvantages of the related art.

An object of the present invention is to provide an electro-luminescent display and a driving method thereof which provides a simplified data driving circuit, as well as a simplified fabricating method thereof, by improving the construction which enables it to produce fine colors despite applying the same data driving waveform to the respective R, G, and B pixels.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a gate line, first to third data lines defining first to third pixel regions, respectively, the first to third data lines crossing with the gate line, first to third power supply lines passing through the first to third pixel regions, switching devices formed in respective pixel regions connected electrically to the gate line and the data lines, driving devices formed in the respective pixel regions, having a gate connected to a corresponding one of the switching devices, and a source connected to a corresponding power supply line, first to third electro-luminescent diodes corresponding to the first to third pixel regions, each said electro-luminescent diode being connected to a drain of a corresponding driving device, and first to third power source supply terminals connected to the first to third power supply lines, respectively.

In another aspect, a method is provided for driving an electro-luminescent display including a gate line, first to third data lines defining first to third pixel regions, respectively, the first to third data lines crossing with the gate line, first to third power supply lines passing through the first to third pixel regions, switching devices formed in respective pixel regions connected electrically to the gate line and the data lines, driving devices formed in the respective pixel regions, having a gate connected to a corresponding one of the switching devices and a source connected to a corresponding power supply line, first to third electro-luminescent diodes corresponding to the first to third pixel regions, each said electro-luminescent diode being connected to a drain of a corresponding driving device, and first to third power source supply terminals connected to the first to third power supply lines, respectively. The method includes applying an identical waveform to the first to third data lines, and applying different power source voltages to the first to third power supply lines, respectively.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principles of the invention.

DETAILED DESCRIPTION OF PREFERRED EMBODIMENTS

Reference will now be made in detail to the preferred embodiments of the present invention, examples of which are illustrated in the accompanying drawings.

Figure 4:
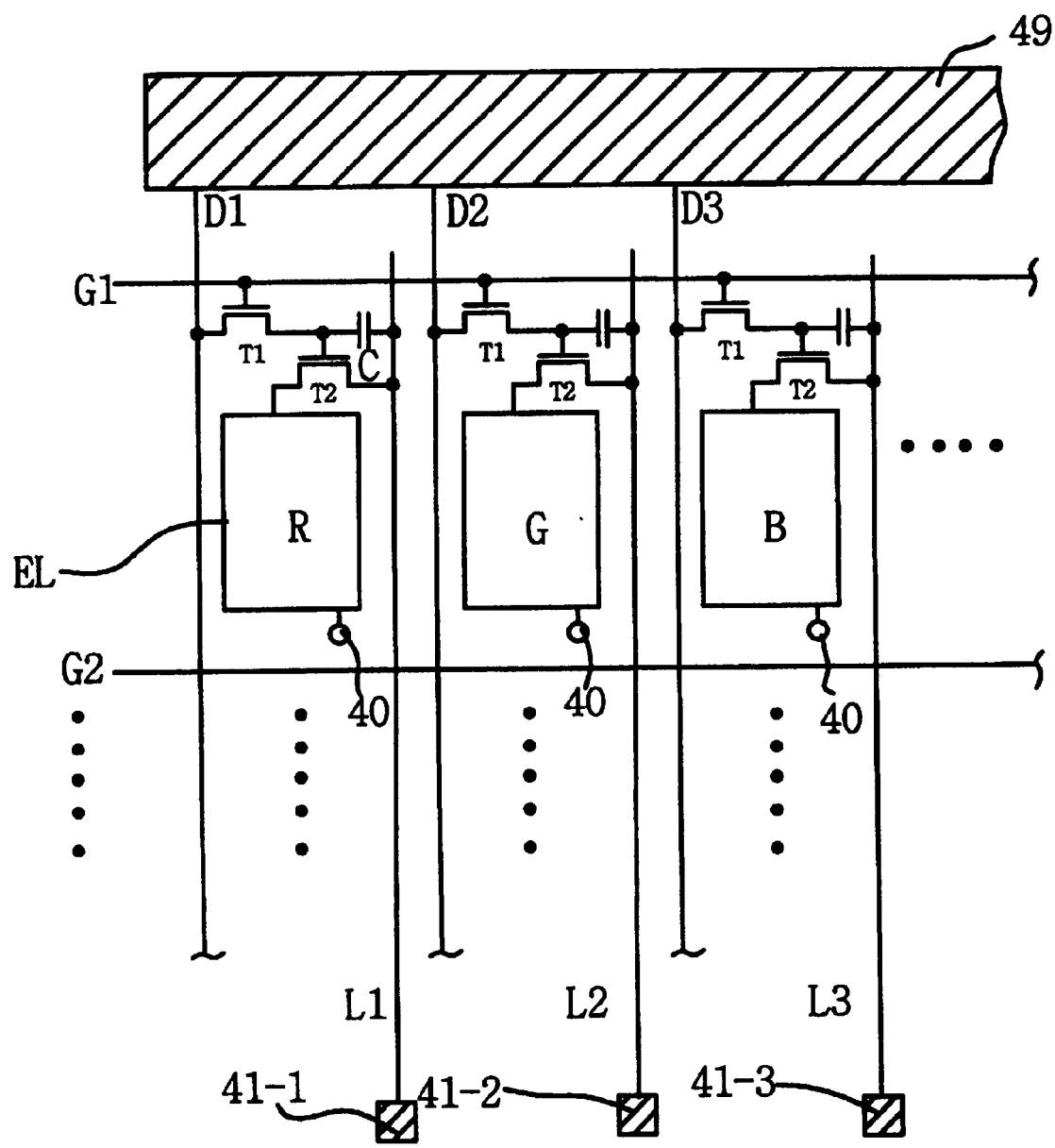
FIG. 4 shows a circuit of an ELD according to an embodiment of the present invention.

FIG. 4 shows a circuit of an ELD according to an embodiment of the present invention, wherein pixels emitting red, green, and blue lights R, G, and B, respectively are arranged on a substrate.

Figure 1:
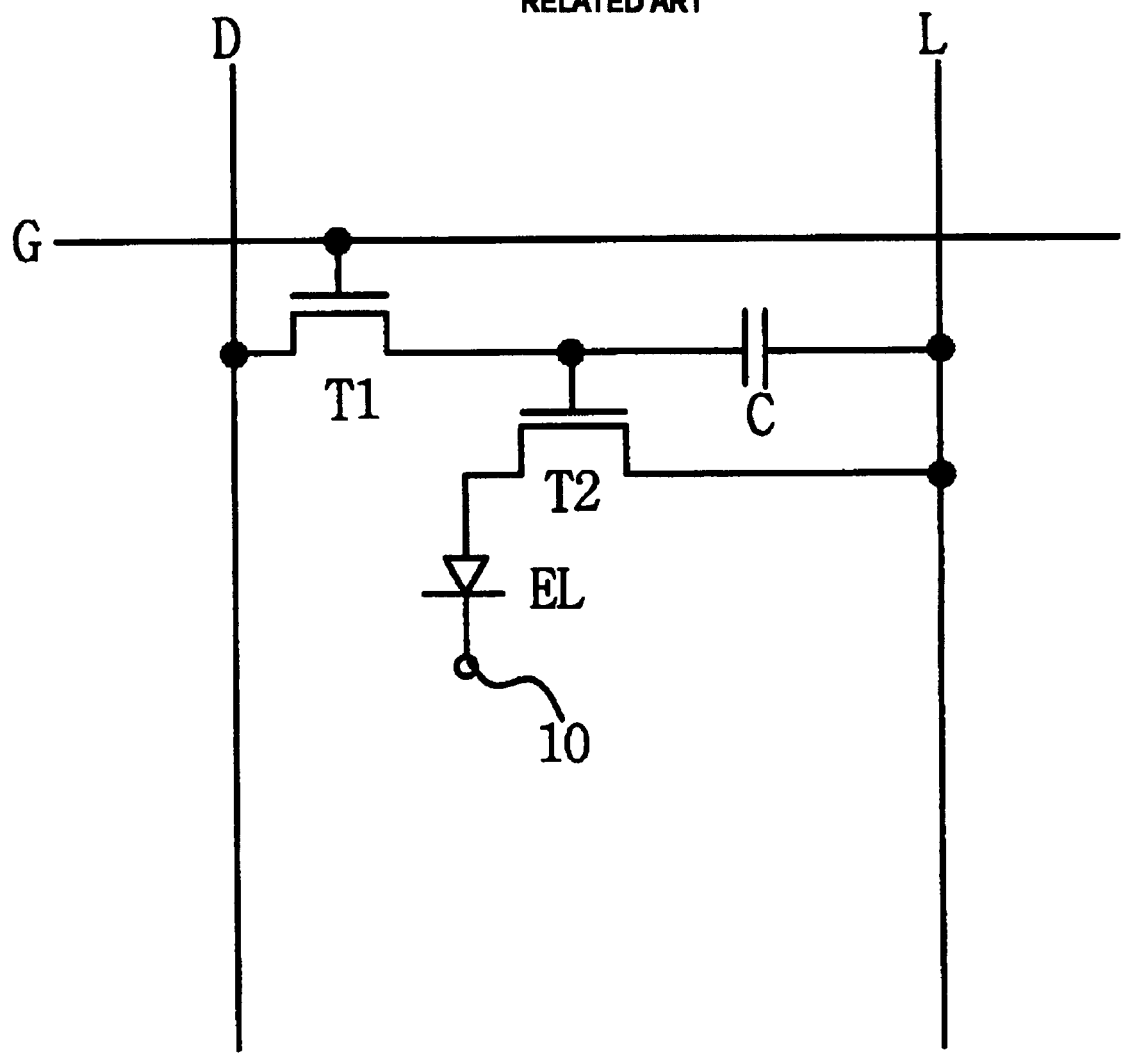
FIG. 1 shows a general schematic equivalent circuit of a unit cell in an ELD.
Figure 2:
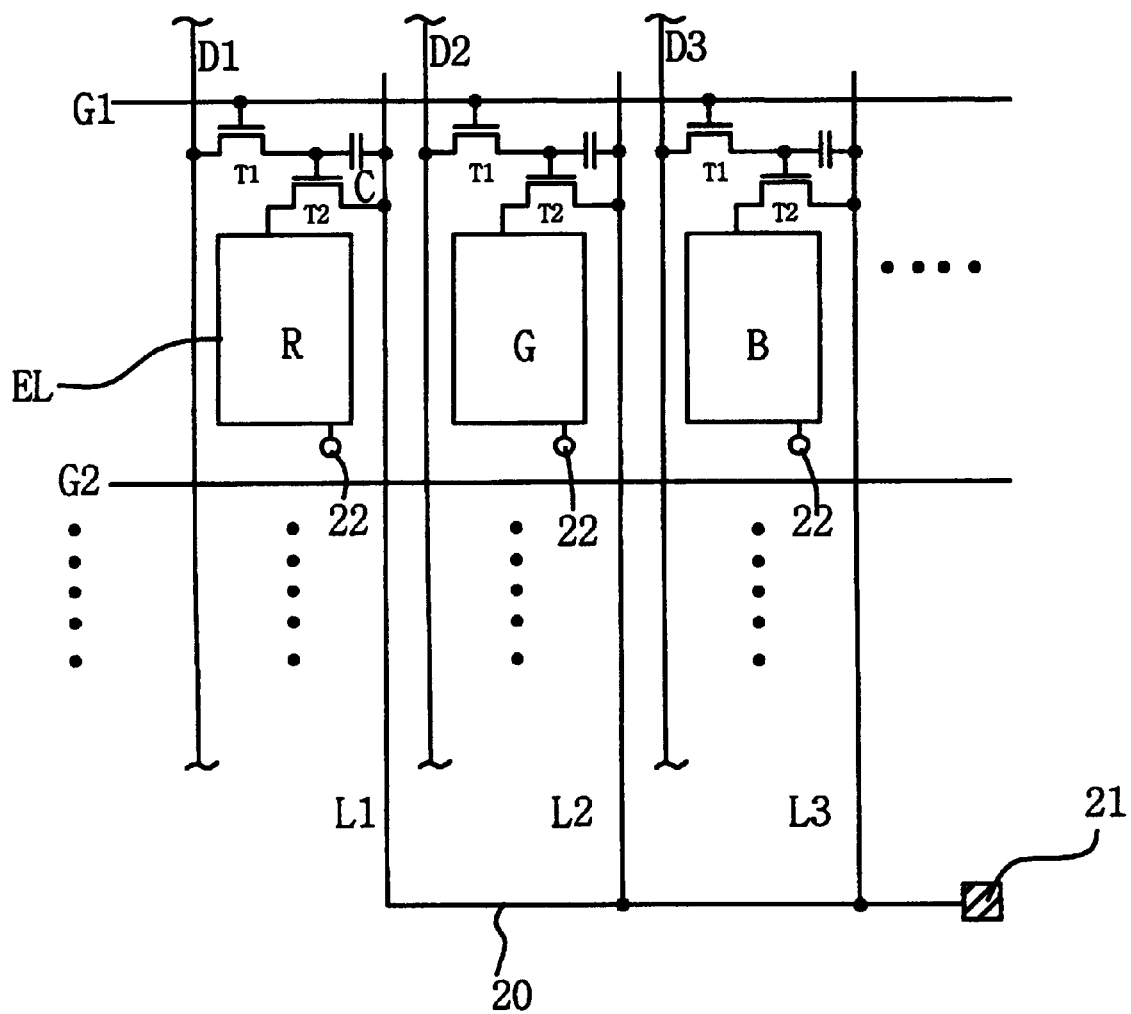
FIG. 2 shows a circuit of an ELD according to a related art, wherein pixels emitting red, green, and blue lights R, G, and B, respectively are arranged on a substrate.
Figure 3:
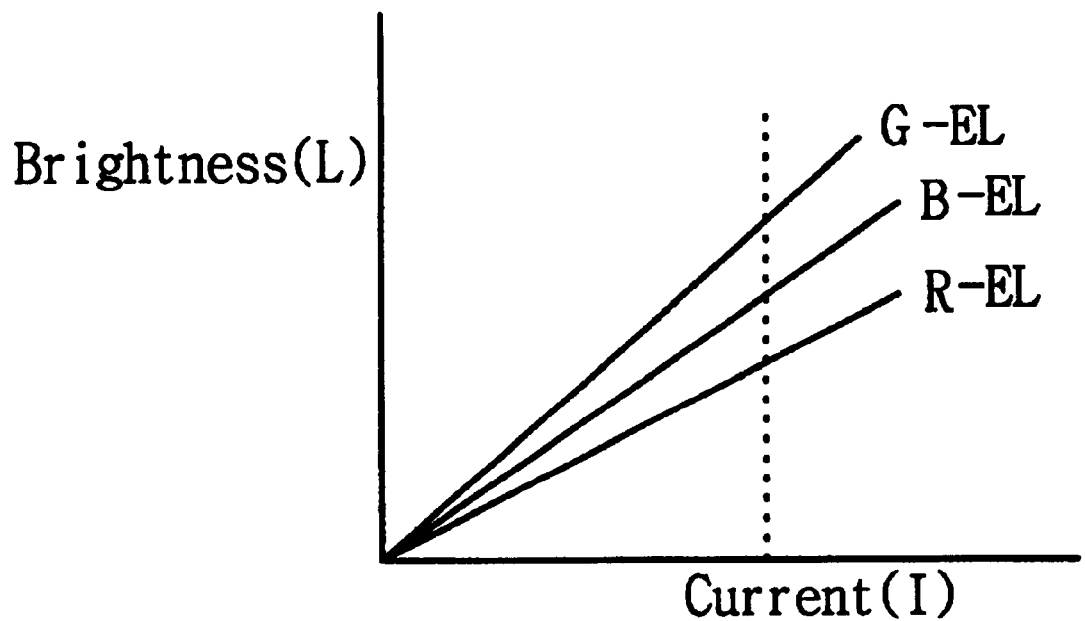
FIG. 3 shows brightness characteristics as a function of current for an EL diode.

The basic structures of the respective pixels are the same as those explained with respect to FIG. 1. Thus, the description of the same parts will be skipped in the following description.

Referring to FIG. 4, a plurality of pixel regions are defined by a plurality of gate lines G1, G2, . . . , and data lines D1, D2, . . . crossing one another. And, a plurality of power supply lines L1, L2, L3, . . . are arranged in parallel with the data lines D1, D2, D3 . . . Alternatively, the power supply lines may be arranged in parallel with the gate lines.

Each of the pixel regions is equipped with a switching device T1, a driving device T2, a storage capacitor C, and an EL diode EL. In this case, each of the pixels may be defined by "R", "G", and "B" pixels emitting red, green, and blue light, respectively, according to the luminescent colors emitted by the respective EL substances constructing the EL diode EL. The R, G, and B pixels are arranged as a unit.

In this case, a first power supply line L1 passing through the R pixel, a second power supply line L2 passing through the G pixel, and a third power supply line L3 passing through the B pixel are connected to first to third power source voltage terminals 41-1, 41-2, and 41-3, respectively, thereby receiving different power source voltages.

Therefore, the respective power supply lines L1, L2, and L3 passing through the R, G, and B pixels are driven by the voltages set to predetermined levels.

The operation of the above-constructed ELD is explained in the following description.

If a gate signal is applied to the first gate line G1 by a gate driver (not shown in the drawing), the respective switching devices T1 of the respective pixels which are connected to the first gate line G1 are turned on by being activated. And, the data voltage generated from the data driver 49 is applied to the turned-on pixels in order. In this case, the same driving waveform is applied to the unit constructed with the R, G, and B pixels.

Such data voltage passes through the respective switching devices T1 to be stored in the storage capacitor C. Once the switching device T1 becomes turned off, a voltage of the storage capacitor C maintains its voltage level until the gate line G1 is selected again.

In this case, the storage capacitor C keeps the voltage VGS applied between the gate and source of the driving device T2. Thus, a source current depending on the gate voltage of the driving device T2 is transferred to the common electrode 40 through the driving device T2 and the EL diode EL from the power supply line L, thereby resulting in the luminescence of the EL diode.

The respective power supply lines L1, L2, and L3 formed in the pixel receive power source voltages independently set by the respective power source voltage terminals 41-1, 41-2, and 41-3, respectively. Thus, different currents flow in the respective EL diodes from the respective power supply lines through the respective driving devices. Thus, the driving device T2, which reacts on a selection signal applied selectively to the gate line G and the data line D, controls the current flowing from the power supply line L through the driving device T2.

The current of the EL diode EL is controlled by the driving device T2, and the EL diode EL emits light having a brightness which corresponds to the current. For instance, if a predetermined gate voltage is applied to the gate of the driving device T2, the level of the current flowing through the driving device T2 is determined and the other current flowing through the EL diode EL is fixed in accordance with the current of the driving device T2.

Various power source voltages set differently are applied to the first to third power source voltage terminals 41-1 to 41-3 of the respective pixels. Even though the R, G, and B pixels forming the unit receive the same data waveform, waveforms flowing in the EL diode through the driving device differ respectively. Namely, in order to satisfy the different amount of the current required by each of the R, G, and B pixels in the ELD to which the same data driving waveform is applied, different power source voltages are applied to the first to third power supply lines L1, L2, and L3.

Therefore, the currents flowing in the respective EL diodes of the R, G, and B pixels are proper for the brightness desired for the respective pixels, thereby making the respective pixels produce colors.

As mentioned in the above description, an ELD of which respective pixels receive the same driving waveform according to the present invention enables to drive the currents to flow the EL diodes of the respective pixels independently to meet the needs required by the respective pixels, thereby producing precise colors.

Accordingly, the present invention enables driving R, G, and B pixels independently without a complicatedly-designed driving circuit in a data driving circuit, thereby simplifying a data driving circuit as well as reducing the product cost.

It will be apparent to those skilled in the art that various modifications and variations can be made in an electro-luminescent display and a driving method thereof of the present invention without departing from the spirit or scope of the inventions. Thus, it is intended that the present invention cover the modifications and variations of this invention provided they come within the scope of the appended claims and equivalents.

What is claimed is:

1. An electro-luminescent display, comprising:

a gate line;

first to third data lines defining first to third pixel regions, respectively, the first to third data lines crossing with the gate line;

first to third power supply lines passing through the first to third pixel regions, first to third switching devices formed in respective pixel regions and connected electrically to the gate line and the respective data lines;

first to third driving devices formed in the respective pixel regions, each having a gate connected to a corresponding one of the switching devices and a source connected to a corresponding one of the power supply lines;

first to third electro-luminescent diodes corresponding to the first to third pixel regions, each said electro-luminescent diode being connected to a drain of a corresponding driving device; and first to third power source supply terminals connected to the first to third power supply lines, respectively, wherein the first to third power source supply terminals have respectively first to third power supply voltages each set to a different predetermined level.

2. The electro-luminescent display according to claim 1, wherein first to third storage capacitors are connected between the switching devices and the power supply lines in the pixel regions, respectively.

3. The electro-luminescent display according to claim 1, wherein the first to third electro-luminescent diodes include a red electro-luminescent diode, a green electro-luminescent diode and a blue electro-luminescent diode.

4. An electro-luminescent display, comprising:

a gate line;

first to third data lines defining first to third pixel regions, respectively, the first to third data lines crossing with the gate line;

first to third power supply lines passing through the first to third pixel regions, respectively;

first to third switching devices formed in respective pixel regions and connected electrically to the gate line and the respective data lines;

first to third driving devices formed in the respective pixel regions, each having a gate connected to a corresponding one of the switching devices and a source connected to a corresponding one of the power supply lines;

first to third electro-luminescent diodes corresponding to the first to third pixel regions, each said electro-luminescent diode being connected to a drain of a corresponding driving device; and first to third power source supply terminals connected to the first to third power supply lines, respectively, wherein the first to third power source supply terminals have respectively first to third power supply voltages each set to a different predetermined level for the said first to third electro-luminescent diodes each produce light having approximately a same brightness when said first to third data lines are connected to a same voltage level.

5. A method of driving electro-luminescent display, the electro-luminescent display including:

a gate line;

first to third data lines defining first to third pixel regions, respectively, the first to third data lines crossing with the gate line;

first to third power supply lines passing through the first to third pixel regions, respectively;

switching devices formed in respective pixel regions connected electrically to the gate line and the data lines;

driving devices formed in the respective pixel regions, each said driving device having a gate connected to a corresponding one of the switching devices and a source connected to a corresponding one of the power supply lines;

first to third electro-luminescent diodes corresponding to the first to third pixel regions, each said electro-luminescent diode being connected to a drain of a corresponding driving device; and first to third power source supply terminals connected to the first to third power supply lines, respectively, the method comprising:

applying an identical waveform to the first to third data lines; and applying different power source voltages to each of the first to third power supply lines, respectively.

6. The method of claim 5, wherein the first to third electro-luminescent diodes include a red electro-luminescent diode, a green electro-luminescent diode and a blue electro-luminescent diode, and said different power source voltages are selected such that said first to third electro-luminescent diodes each produce light having approximately a same brightness.

7. An electro-luminescent display, comprising:

a gate line;

first to third data lines defining first to third pixel regions, respectively, the first to third data lines crossing with the gate line and having corresponding first to third data voltages;

first to third electro-luminescent diodes corresponding to the first to third pixel regions;

diode driving means for supplying a different current to each of said electro-luminescent diodes when said first to third data voltages have an identical waveform.

8. The electro-luminescent display of claim 7, wherein said first to third electro-luminescent diodes include a red electro-luminescent diode, a green electro-luminescent diode and a blue electro-luminescent diode.

9. The electro-luminescent display of claim 8, wherein the first to third power source supply terminals have respectively first to third power supply voltages each set to a different predetermined level such that said first to third electro-luminescent diodes each produce light having approximately a same brightness when said first to third data lines are connected to a same voltage level.

* * * * *

UNITED STATES PATENT AND TRADEMARK OFFICE
CERTIFICATE OF CORRECTION

PATENT NO. : 6,583,577 B1 Page 1 of 1
DATED : June 24, 2003
INVENTOR(S) : Woong S. Choi et al.

It is certified that error appears in the above-identified patent and that said Letters Patent is hereby corrected as shown below:

Column 5,
Line 58, after "regions," please insert -- respectively; --.

Signed and Sealed this

Fourteenth Day of October, 2003

JAMES E. ROGAN
*Director of the United States Patent and Trademark Office*